(12) United States Patent
Sai et al.

(10) Patent No.: US 8,659,472 B2
(45) Date of Patent: Feb. 25, 2014

(54) METHOD AND APPARATUS FOR HIGHLY ACCURATE HIGHER FREQUENCY SIGNAL GENERATION AND RELATED LEVEL GAUGE

(75) Inventors: Bin Sai, Zuid Holland (NL); Ronald C. Sehrier, Delft (NL)

(73) Assignee: Enraf B.V., Delft (NL)

( * ) Notice: Subject to any disclaimer, the term of this patent is extended or adjusted under 35 U.S.C. 154(b) by 686 days.

(21) Appl. No.: 12/534,723

(22) Filed: Aug. 3, 2009

(65) Prior Publication Data
US 2010/0066589 A1    Mar. 18, 2010

Related U.S. Application Data

(60) Provisional application No. 61/098,146, filed on Sep. 18, 2008.

(51) Int. Cl.
| | |
|---|---|
| *G01S 13/08* | (2006.01) |
| *G01F 23/22* | (2006.01) |
| *G01F 23/284* | (2006.01) |
| *G01S 7/35* | (2006.01) |
| *G01S 13/00* | (2006.01) |

(52) U.S. Cl.
USPC .................. 342/124; 331/1 R; 331/2; 331/46; 331/50; 331/53; 342/73; 342/82; 342/118; 342/175; 73/290 R; 324/600; 324/629; 324/637; 324/642; 324/644

(58) Field of Classification Search
USPC ................. 342/118, 124, 128–133, 175, 195, 342/82–103, 200, 201, 73; 331/1 R, 2, 331/17–33, 46–56; 324/600, 629, 637–646; 73/290 R, 304 R, 304 C; 455/91, 118
See application file for complete search history.

(56) References Cited

U.S. PATENT DOCUMENTS 3,217,267 A * 11/1965 Loposer ........................ 331/17
3,337,814 A *  8/1967 Brase et al. .................... 331/18
(Continued)

FOREIGN PATENT DOCUMENTS

| DE | 296 08 551 U1 | 7/1996 |
| DE | 100 40 180 A1 | 4/2002 |

(Continued)

OTHER PUBLICATIONS

"HERMetic Sensor", Honeywell Enraf, (no month) 2007, 5 pages.

(Continued)

*Primary Examiner* — Bernarr Gregory

(57) ABSTRACT

An apparatus includes a stable local oscillator, which includes a first control loop. The first control loop includes a first voltage-controlled oscillator configured to generate a first output signal and a first phase-locked loop. The apparatus also includes a frequency up-converter configured to increase a frequency of the first output signal. The apparatus further includes a second control loop configured to receive the up-converted first output signal. The second control loop includes a second voltage-controlled oscillator configured to generate a second output signal and a second phase-locked loop. The second control loop may further include a mixer having a first input coupled to the frequency up-converter, a second input coupled to the second voltage-controlled oscillator, and an output coupled to the second phase-locked loop. A reference frequency source may be configured to generate a signal identifying a reference frequency and to provide that signal to the phase-locked loops.

21 Claims, 5 Drawing Sheets

(56) References Cited

U.S. PATENT DOCUMENTS

| | | | |
|---|---|---|---|
| 3,353,104 A * | 11/1967 | Loposer | 331/25 |
| 3,579,281 A * | 5/1971 | Kam et al. | 331/17 |
| 3,789,302 A * | 1/1974 | Rearwin et al. | 331/25 |
| 3,903,482 A * | 9/1975 | Pausini et al. | 331/17 |
| 4,000,476 A * | 12/1976 | Walker et al. | 331/17 |
| 4,024,464 A * | 5/1977 | Underhill et al. | 331/17 |
| 4,027,274 A * | 5/1977 | Fukui et al. | 331/17 |
| 4,068,199 A * | 1/1978 | Madoff | 331/25 |
| 4,072,947 A * | 2/1978 | Johnson | 342/103 |
| 4,114,110 A * | 9/1978 | Nossen | 331/2 |
| 4,361,801 A * | 11/1982 | Meyer et al. | 324/638 |
| 4,451,930 A | 5/1984 | Chapman et al. | |
| 4,510,461 A * | 4/1985 | Dickes et al. | 331/2 |
| 4,516,084 A * | 5/1985 | Crowley | 331/2 |
| 4,567,448 A * | 1/1986 | Ikeda | 331/25 |
| 4,675,617 A * | 6/1987 | Martin | 331/47 |
| 4,691,176 A * | 9/1987 | Hsiung et al. | 331/2 |
| 4,800,341 A * | 1/1989 | Johnson | 331/2 |
| 4,823,399 A * | 4/1989 | George | 331/22 |
| 4,868,494 A * | 9/1989 | Ryder et al. | 324/637 |
| 4,928,525 A | 5/1990 | Aderholt et al. | |
| 4,958,228 A * | 9/1990 | Kutsuki | 331/20 |
| 4,972,160 A * | 11/1990 | Sylvain | 331/17 |
| 5,027,526 A | 7/1991 | Crane | |
| 5,034,703 A | 7/1991 | Schumacher | |
| 5,036,291 A * | 7/1991 | Marz | 331/23 |
| 5,052,028 A * | 9/1991 | Zwack | 331/49 |
| 5,210,539 A * | 5/1993 | Voyce | 342/83 |
| 5,270,669 A * | 12/1993 | Jokura | 331/2 |
| 5,400,253 A | 3/1995 | O'Connor | |
| 5,406,842 A | 4/1995 | Locke | |
| 5,428,361 A * | 6/1995 | Hightower et al. | 342/201 |
| 5,442,359 A | 8/1995 | Rubin | |
| 5,446,416 A * | 8/1995 | Lin et al. | 331/2 |
| 5,572,167 A * | 11/1996 | Alder et al. | 331/2 |
| 5,708,424 A | 1/1998 | Orlando et al. | |
| 5,734,302 A * | 3/1998 | Teng et al. | 331/2 |
| 5,773,913 A | 6/1998 | Casselden | |
| 5,774,089 A | 6/1998 | Bamler et al. | |
| 5,923,284 A | 7/1999 | Artis et al. | |
| 5,994,905 A * | 11/1999 | Franchville | 324/642 |
| 6,107,957 A | 8/2000 | Cramer et al. | |
| 6,114,987 A * | 9/2000 | Bjornholt | 342/200 |
| 6,374,187 B1 | 4/2002 | Knight et al. | |
| 6,404,288 B1 | 6/2002 | Bletz et al. | |
| 6,486,826 B1 * | 11/2002 | Cramer et al. | 342/124 |
| 6,621,449 B1 * | 9/2003 | Kunert | 342/124 |
| 6,628,229 B1 * | 9/2003 | Johnson et al. | 342/124 |
| 6,629,458 B1 | 10/2003 | Westerling et al. | |
| 6,636,575 B1 * | 10/2003 | Ott | 331/17 |
| 6,662,649 B1 | 12/2003 | Knight et al. | |
| 6,671,500 B2 * | 12/2003 | Damgaard et al. | 455/118 |
| 6,762,634 B1 * | 7/2004 | Hattori | 331/49 |
| 6,774,732 B1 * | 8/2004 | Harnishfeger et al. | 331/25 |
| 6,876,261 B2 * | 4/2005 | Gumm | 331/18 |
| 6,876,621 B2 | 4/2005 | Ohuchida et al. | |
| 7,135,870 B2 * | 11/2006 | Mohajer et al. | 324/639 |
| 7,891,229 B2 | 2/2011 | Sai | |
| 2002/0101373 A1 | 8/2002 | Arndt et al. | |
| 2002/0183030 A1 | 12/2002 | Damgaard et al. | |
| 2003/0167839 A1 | 9/2003 | Burger et al. | |
| 2004/0196177 A1 | 10/2004 | Billington et al. | |
| 2004/0207477 A1 | 10/2004 | Gumm | |
| 2005/0052314 A1 | 3/2005 | Spanke et al. | |
| 2005/0190098 A1 | 9/2005 | Bridgelall et al. | |
| 2005/0206555 A1 | 9/2005 | Bridgelall et al. | |
| 2006/0044145 A1 | 3/2006 | Akerstrom et al. | |
| 2006/0044147 A1 | 3/2006 | Knox et al. | |
| 2006/0143000 A1 | 6/2006 | Setoguchi | |
| 2007/0046528 A1 | 3/2007 | Larsson et al. | |
| 2007/0109177 A1 | 5/2007 | Baath et al. | |
| 2010/0002912 A1 | 1/2010 | Solinsky | |
| 2010/0037673 A1 | 2/2010 | Wicht et al. | |
| 2010/0070207 A1 | 3/2010 | Sai | |
| 2010/0070208 A1 | 3/2010 | Sai | |
| 2010/0070209 A1 | 3/2010 | Sai | |
| 2010/0175470 A1 | 7/2010 | Schrier et al. | |
| 2010/0241369 A1 | 9/2010 | Wicht et al. | |
| 2011/0163910 A1 | 7/2011 | Sai | |

FOREIGN PATENT DOCUMENTS

| | | |
|---|---|---|
| DE | 10 2004 061449 A1 | 6/2006 |
| DE | 10 2005 019 095 A1 | 10/2006 |
| EP | 0 573 034 A | 12/1993 |
| EP | 0 887 658 A | 12/1998 |
| GB | 2 064 188 A | 6/1981 |
| GB | 2 342 995 A | 4/2000 |
| NL | 1032192 | 7/2006 |
| WO | WO 98/12514 A1 | 3/1998 |
| WO | WO 2004/018978 A1 | 3/2004 |
| WO | WO 2004/053521 A1 | 6/2004 |
| WO | WO 2007/053007 A1 | 5/2007 |
| WO | WO 2007/111498 A2 | 10/2007 |
| WO | WO 2008/010702 A1 | 1/2008 |
| WO | WO 2008/104967 A2 | 9/2008 |
| WO | WO 2010/019427 A2 | 2/2010 |

OTHER PUBLICATIONS

"Servo Gauge 854ATG" Product Sheet, Enraf B.V., May 2008, 4 pages.
"Starrett Digitape 25", 1999 and possibly earlier, 4 pages.
European Search Report dated Aug. 17, 2010 in connection with European Patent Application No. EP 10 15 5559.
International Standard, Petroleum and liquid petroleum products-Measurement of level and temperature in storage tanks by automatic methods, Part 3: Measurement of level in pressurized storage tanks (non-refrigerated), 1st Edition, Nov. 15, 2002, 21 pages.
"Level sensor", wikipedia.org, Aug. 2, 2008, 8 pages.
Communication pursuant to Article 94(3) EPC dated Jan. 11, 2010 in connection with European Patent Application No. EP 09169534.
European Search Report dated Dec. 14, 2009 in connection with European Patent Application No. EP 09169534.
Notification of Transmittal of the International Search Report and the Written Opinion of the International Searching Authority, or the Declaration dated Oct. 28, 2008 in connection with PCT Patent Application No. PCT/NL2008/000196.
Bai Sin, et al., "Advanced High Precision Radar Gauge for Industrial Applications", Proceedings of the 2006 CIE International Conference on Radar, vol. 1, Oct. 16, 2006, pp. 463-466.
Partial European Search Report dated Dec. 10, 2009 in connection with European Patent Application No. EP 09 16 9962.
Communication pursuant to Article 94(3) EPC dated Apr. 12, 2010 in connection with European Patent Application No. 09 169 962.9.
Summons to attend oral proceedings pursuant to Rule 115(1) EPC dated Jun. 16, 2011 in connection with European Patent Application No. 09 169 962.9.

* cited by examiner

METHOD AND APPARATUS FOR HIGHLY ACCURATE HIGHER FREQUENCY SIGNAL GENERATION AND RELATED LEVEL GAUGE

CROSS-REFERENCE TO RELATED APPLICATIONS

This application claims priority under 35 U.S.C. §119(e) to U.S. Provisional Application No. 61/098,146 filed on Sep. 18, 2008, which is hereby incorporated by reference.

TECHNICAL FIELD

This disclosure relates generally to inventory management systems. More specifically, this disclosure relates to a method and apparatus for highly accurate higher frequency signal generation and related level gauge.

BACKGROUND

Processing facilities and other facilities routinely include tanks for storing liquid materials and other materials. For example, storage tanks are routinely used in tank farm facilities and other storage facilities to store oil or other materials. As another example, oil tankers and other transport vessels routinely include numerous tanks storing oil or other materials.

Often times, it is necessary or desirable to measure the amount of material stored in a tank. This may be useful, for example, during custody transfer applications when material is being transferred from one party to another, such as from a seller to a buyer. During these types of applications, the amount of material in a tank often must be measured with high precision. In bulk storage tanks, an error of one millimeter in a level reading can correspond to several cubic meters of volumetric error. This can result in losses of thousands of dollars for one or more parties. High-precision measurements often require high accuracy (such as ±1 mm) over a wide range of temperatures (such as −40° F. to +185° F.).

One approach to measuring the amount of material in a tank involves the use of radar measurements. In this approach, radar signals are transmitted towards and reflected off the surface of the material in the tank. Radar accuracy is often directly associated with the stability of frequency signal generation. However, radar signals are often generated using voltage-controlled oscillators (VCOs), and voltage-controlled oscillators typically suffer from ambient temperature variations and high noise levels, particularly when used with higher-frequency electromagnetic waves such as millimeter waves (MMW). As a result, analog components and circuits often need to implement complicated compensation circuitry to cope with temperature variations and time drifts that occur during the frequency signal generation. These traditional solutions are often expensive and sometimes awkward, especially for frequencies higher than 20 GHz.

A phase-locked loop (PLL) can be used to stabilize a voltage-controlled oscillator by forming a closed loop so that a frequency produced by the voltage-controlled oscillator is relatively stable or "locked." This solution is effective if the frequency range of the voltage-controlled oscillator can be covered by the phase-locked loop's bandwidth. This is typically true for the frequency range below 10 GHz because of limitations of current phase-locked loop chips. For frequencies higher than 10 GHz, a dielectric resonance oscillator (DRO) is often adopted as a local oscillator to down-convert higher frequencies to lower frequencies that can match a phase-locked loop's tuning range. However, dielectric resonance oscillators are still susceptible to temperature variations, which results in variations of the locked frequencies. This also introduces errors in signal processing using signal frequency and/or bandwidth information. One reason for using higher frequencies in radar level gauging technologies is that national and international regulations may limit the use of larger bandwidths at lower frequencies. These regulatory constraints can have a negative impact on high precision radar level measurements.

SUMMARY

This disclosure provides a method and apparatus for highly accurate higher frequency signal generation and related level gauge.

In a first embodiment, an apparatus includes a stable local oscillator, which includes a first control loop. The first control loop includes (i) a first voltage-controlled oscillator configured to generate a first output signal and (ii) a first phase-locked loop. The apparatus also includes a frequency up-converter configured to increase a frequency of the first output signal. The apparatus further includes a second control loop configured to receive the up-converted first output signal. The second control loop includes (i) a second voltage-controlled oscillator configured to generate a second output signal and (ii) a second phase-locked loop.

In a second embodiment, a level gauge includes a sensor configured to transmit wireless signals towards material in a tank and receive wireless signals reflected off the material in the tank. The level gauge also includes a processing system configured to identify a level of the material in the tank based on the wireless signals transmitted towards and reflected off the material in the tank. The sensor includes a phase-locked loop based stable local oscillator configured to generate a first output signal and a phase-locked loop based control loop configured to generate a second output signal based on the first output signal.

In a third embodiment, a method includes generating a first signal using a stable local oscillator that includes a first control loop. The first control loop includes a first voltage-controlled oscillator and a first phase-locked loop. The method also includes increasing a frequency of the first signal to produce an up-converted first signal. The method further includes generating a second signal based on the up-converted first signal using a second control loop. The second control loop includes a second voltage-controlled oscillator and a second phase-locked loop.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
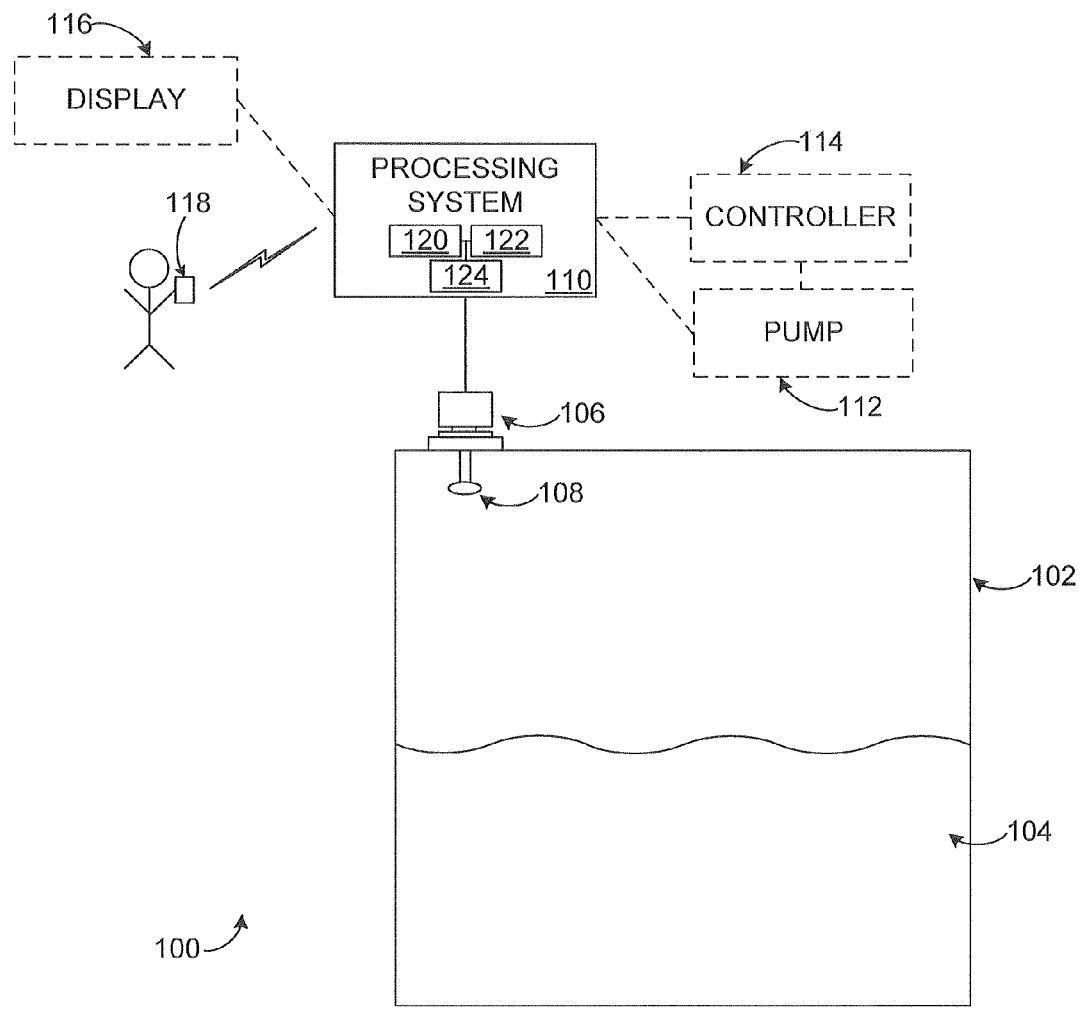
FIG. 1 illustrates an example tank level measurement system according to this disclosure.

FIG. 1 illustrates an example tank level measurement system 100 according to this disclosure. In this example, the system 100 includes a tank 102 that can store one or more materials 104. The tank 102 generally represents any suitable structure for receiving and storing at least one liquid or other material. The tank 102 could, for example, represent an oil storage tank or a tank for storing other liquid(s) or other material(s). The tank 102 could also have any suitable shape and size. Further, the tank 102 could form part of a larger structure. The larger structure could represent any fixed or movable structure containing or associated with one or more tanks 102, such as a movable tanker vessel, railcar, or truck or a fixed tank farm.

A sensor 106 with at least one antenna 108 is used in conjunction with a processing system 110 to measure the level of material 104 in the tank 102. The antenna 108 emits electromagnetic waves or other wireless signals towards the material 104 and receives reflected signals from the material 104. The sensor 106 includes any suitable structure for generating signals for wireless transmission and for receiving reflected signals. The antenna 108 includes any suitable structure for transmitting and/or receiving wireless signals, such as a planar or horn antenna.

Data from the sensor 106 is provided to the processing system 110. The processing system 110 can use the data from the sensor 106 in any suitable manner. For example, the sensor 106 could provide data identifying the transmitted and reflected signals, and the processing system 110 can analyze the data to identify the level of the material 104 in the tank 102. The processing system 110 could also use the determined level in any suitable manner. For example, the processing system 110 could control automatic loading or unloading of the tank 102 by controlling a pump 112 or by providing the determined level to an external controller 114 that controls the pump 112. The processing system 110 could also notify personnel responsible for controlling the loading or unloading of the tank 102, such as by displaying the determined level on a display 116 or transmitting the determined level to a wireless or other device 118.

The processing system 110 could represent any suitable computing or processing system or device, such as a computing device, a process controller, or other system or device. In particular embodiments, the processing system 110 includes at least one processor 120 and at least one memory 122 storing instructions and data used, generated, or collected by the at least one processor 120. The processing system 110 can also include at least one interface 124 facilitating communication with external devices or systems like the components 106 and 112-118, such as an Ethernet interface, a radio frequency (RF) or other wireless interface, or a serial interface.

In one aspect of operation, the sensor 106 generates wireless signals within a desired frequency band with high stability over a wide temperature range. This can be done using a multiple phased-lock loop (PLL) scheme for higher frequency generation (such as for millimeter waves). For example, a PLL-locked stable local oscillator (STALO) can be used, where frequency up-conversion is controlled by additional PLL-locking circuitry. This multi-PLL design can provide an extremely flexible architecture to generate very high frequencies that various applications and regulations require. This technique can also achieve high stability over a very wide temperature range and achieve better noise performance with fewer components (compared to traditional analog compensation techniques). In particular embodiments, this technique can be applied to radars or other higher-frequency hardware systems that need to provide high performance. One example implementation of a multi-PLL design that can be used in the sensor 106 is shown in FIG. 2, which is described below.

Note that the "level" of material 104 in a tank 102 could refer to the absolute level of the material 104 in the tank 102, such as when the level represents the distance between the top of the material 104 and the bottom of the tank 102. The "level" could also refer to the relative level of the material 104 in the tank 102, such as when the level represents the distance between the top of the material 104 and the antenna 112.

Although FIG. 1 illustrates an example tank level measurement system 100, various changes may be made to FIG. 1. For example, the system 100 could include any number of tanks 102, sensors 106, processing systems 110, and other components. Also, the functional division shown in FIG. 1 is for illustration only. Various components in FIG. 1 could be omitted, combined, or further subdivided and additional components could be added according to particular needs. As a particular example, the processing system 110 could be integrated into (form a part of) the sensor 106.

Figure 2:
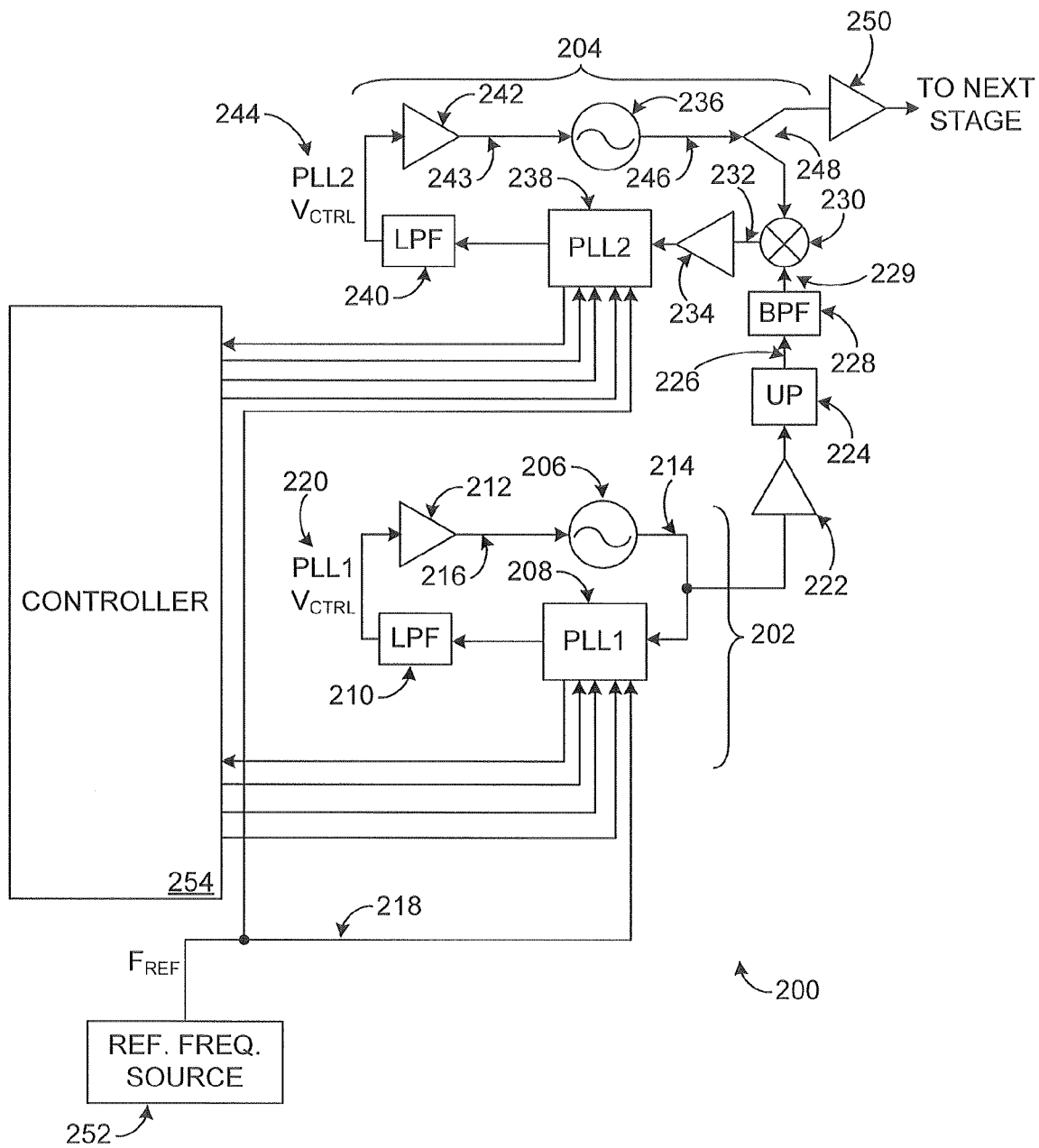
FIG. 2 illustrates an example multiple phase-locked loop (PLL) circuit for highly accurate signal generation according to this disclosure.

FIG. 2 illustrates an example multiple phase-locked loop (PLL) circuit 200 for highly accurate signal generation according to this disclosure. More specifically, this circuit 200 implements a PLL-based stable local oscillator 202, which produces a signal used as an input to a PLL-based control loop 204.

As shown in FIG. 2, the PLL-based stable local oscillator 202 includes a voltage-controlled oscillator 206, a first phase-locked loop (PLL1) module 208, a low-pass filter (LPF) 210, and an amplifier 212. The voltage-controlled oscillator 206 operates to produce a signal 214, which is provided to the PLL-based control loop 204. The voltage-controlled oscillator 206 includes any suitable structure for generating a signal having a frequency based on an input voltage.

The phase-locked loop module 208, the filter 210, and the amplifier 212 operate to generate a tuning voltage 216 that is provided to the voltage-controlled oscillator 206. The phase-locked loop module 208 includes any suitable structure for generating a signal having a stable frequency based on feedback. The phase-locked loop module 208 could, for example, include a phase comparator for comparing the phase of the signal 214 to the phase of a signal 218 having a reference frequency ($F_{REF}$). The filter 210 includes any suitable structure for filtering a signal with an appropriate passband. The amplifier 212 includes any suitable structure for providing amplification based on a first control voltage (PLL1 $V_{CTRL}$) 220, which in this example is based on the output of the filter 210. The control voltage 220 illustrates the flexible control of the tuning range of the voltage-controlled oscillator 206 by the first phase-locked loop module 208.

The signal 214 produced by the PLL-based stable local oscillator 202 is provided to a buffer 222, which buffers the signal 214. The buffered signal 214 is provided to a frequency up-converter 224, which increases the frequency of the buffered signal 214 to produce an up-converted signal 226. For example, the frequency up-converter 224 could increase the frequency of the signal 214 by a factor of two or four, although other factors could be used. The frequency up-converter 224 represents any suitable structure for increasing the frequency of a signal. The up-converted signal 226 is filtered by a bandpass filter (BPF) 228, which includes any suitable structure for filtering a signal with an appropriate passband.

The filtered signal 229 is provided to the PLL-based control loop 204. More specifically, the filtered signal 229 is provided to one input of a mixer 230, which mixes the filtered signal 229 with another signal to produce a mixed signal 232. The mixer 230 includes any suitable structure for mixing signals. The mixed signal 232 is amplified by an amplifier 234, which represents any suitable structure for providing amplification.

The PLL-based control loop 204 also includes a voltage-controlled oscillator 236, a second phase-locked loop (PPL2) module 238, a low-pass filter 240, and an amplifier 242 controlled by a second control voltage (PPL2 $V_{CTRL}$) 244, which in this example is based on the output of the filter 240. The control voltage 244 illustrates the flexible control of the tuning range of the voltage-controlled oscillator 236 by the second phase-locked loop module 238. These components 236-242 have the same or similar functionality as the corresponding components 206-212 described above (except the components 236-242 handle signals at higher frequencies). The amplifier 242 produces a tuning voltage 243 for the voltage-controlled oscillator 236.

A signal 246 produced by the voltage-controlled oscillator 236 is provided via a divider, coupler, or splitter 248 to the second input of the mixer 230, as well as to a buffer 250. The buffer 250 buffers the signal 246 before providing the buffered signal to a subsequent stage. The subsequent stage could represent a stage designed to use the signal 246 for transmission or a stage designed to further increase the frequency of the signal 246. The subsequent stage could, for example, include a copy of the components 224-250, where the output of the buffer 250 in FIG. 2 is coupled to the input of the frequency up-converter 224 in the subsequent stage. In other words, the output of the circuit 200 can be inserted/cascaded as a STALO for higher frequency up-conversion using the same PLL-based circuit (PLL2 as illustrated). This may be useful when even higher frequencies are desired or required. In other embodiments, the circuit 200 can be used as an input of direct frequency multiplication or as a direct output to an antenna system for signal radiation.

As a particular example, the PLL-based stable local oscillator 202 could be used to produce a highly stable 20 GHz signal, and the frequency up-converter 224 could use the 20 GHz signal to produce a 60 GHz or 80 GHz signal used by the PLL-based control loop 204. Conventional 60 GHz or 80 GHz free running oscillators are very expensive. Also, the use of a dielectric resonance oscillator (DRO) in place of the PLL-based stable local oscillator 202 would allow for the creation of errors, which would lead to the creation of even larger errors in the signal 226 due to the multiplication effect by the frequency up-converter 224. In contrast, the circuit 200 shown in FIG. 2 helps to overcome drawbacks of using DRO-like oscillators at higher frequencies (since the DRO has temperature-dependent characteristics). The circuit 200 shown in FIG. 2 can generate highly-stable higher-frequency signals using standard off-the-shelf components To keep the multiple PLL modules 208 and 238 in FIG. 2 under control, a single frequency reference source 252 (such as a stable local reference oscillator) can be used for all of the PLLs. This may allow the variation of the frequency band caused by the temperature dependence of the reference oscillator to be handled more easily. Commercial off-the-shelf (COTS) components of a temperature-compensated crystal oscillator (TCXO) with few parts per million (ppm) are widely available on the market, which can ensure a higher measuring accuracy in level gauges (such as ±1 mm). As a result, the multi-PLL circuit 200 can select a single TCXO as a reference input in a way that the variation of the sweep bandwidth or of the generated frequency can be controlled in a simple manner. This allows higher accuracy of level measurements to be attained.

In this example, a controller 254 provides control signals to at least the phase-locked loop modules 208 and 238. In some embodiments, each of the phase-locked loop modules 208 and 238 is implemented using a COTS chip, and the controller 254 provides three standard control signals to each phase-locked loop. Each phase-locked loop module 208 and 238 can also provide a lock detection signal indicating that a frequency has been locked to the controller 254. The controller 254 could control any other aspects of the circuit 200. The controller 254 includes any suitable structure for controlling operation of the circuit 200. As particular examples, the controller 254 could represent a processor, microprocessor, microcontroller, field programmable gate array, digital signal processor, complex programmable logic device, or other processing or control device.

The PLL control voltages (including voltages 220 and 244 as the outputs of the filters 210 and 240) can be arranged in several ways to produce different frequency modulation schemes and waveforms. For example, to generate a stepped-frequency continuous-wave, one control voltage input can be varied to cover the desired frequency band, and other control voltage input(s) can be fixed as constant(s) to provide a constant STALO frequency signal. As another example, two PLLs may vary in a way that allows a specific frequency coding to be generated. This makes the circuit 200 extremely flexible in locked frequency generation for stepped-frequency continuous-wave radar systems, as well as for other systems (such as frequency hopping).

One possible modulation scheme involves digital control by the controller 254, which can make higher frequency analog components extremely stable and consistent over a wide range of temperature variations. In this way, the frequencies, bandwidth, and coding sequence can be easily and flexibly adjusted before or during the operation of the circuit 200, such as by programming the controller 254. One particular implementation can be used as a software-defined radio system, which can be flexibly accommodated to various national and international regulations.

Although FIG. 2 illustrates an example multiple phase-locked loop circuit 200 for highly accurate signal generation, various changes may be made to FIG. 2. For example, as noted above, multiple stages could be used here, depending on the desired or required frequency of the output signal. Also, the implementations of the PLL-based stable local oscillator 202 and the PLL-based control loop 204 are for illustration only.

Figure 3A:
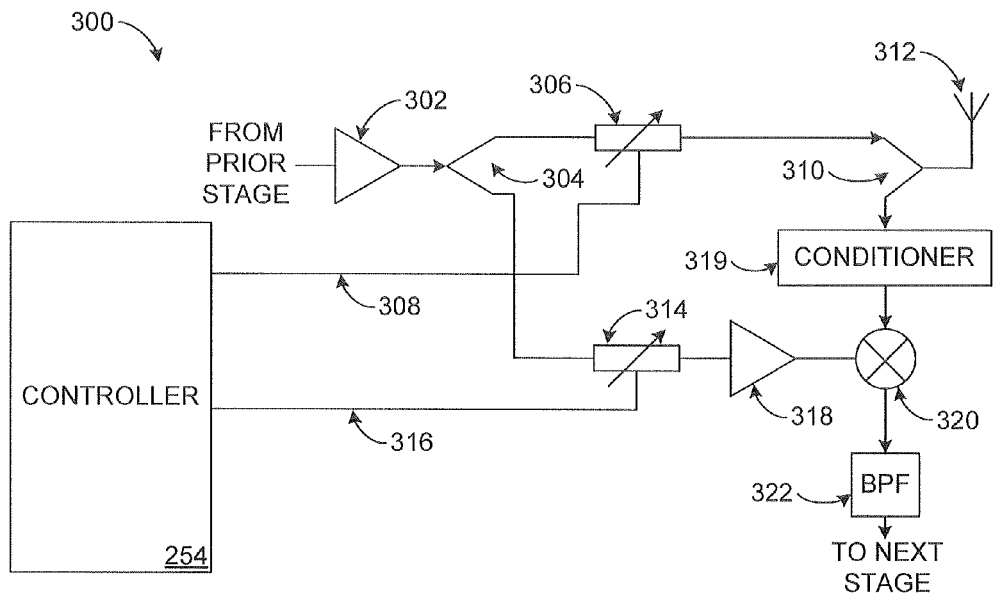
FIGS. 3A and 3B illustrate example adjustable power transmission control circuits using highly accurate signal generation according to this disclosure.
Figure 3B:
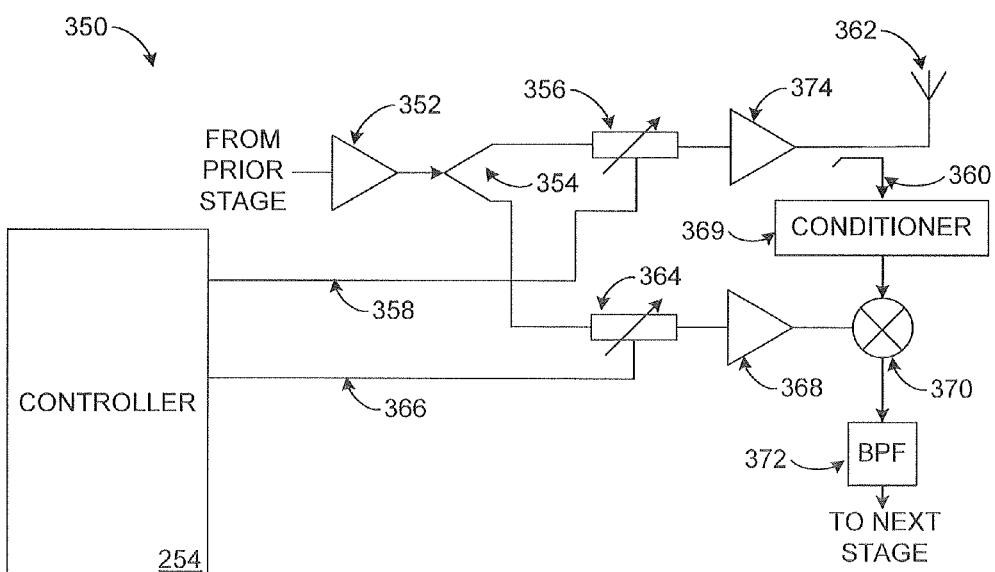

FIGS. 3A and 3B illustrate example adjustable power transmission control circuits 300 and 350 using highly accurate signal generation according to this disclosure. As shown in FIG. 3A, the adjustable power transmission control circuit 300 includes an amplifier 302, which receives and amplifies a signal provided by a prior stage (such as a signal provided by the circuit 200). The amplified signal is provided through a splitter or divider 304 to a variable attenuator 306, which operates to reduce the power of the amplified signal based on a control signal 308 from the controller 254. The attenuated signal is then provided via a splitter, coupler, switch, or duplexer 310 to an antenna 312 for transmission.

The amplified signal from the amplifier 302 is also provided through the splitter or divider 304 to a variable attenuator 314, which also operates to reduce the power of the amplified signal based on a control signal 316 from the controller 254. The attenuated signal from the variable attenuator 314 is provided to an amplifier 318, which amplifies the signal as a local oscillator to drive the mixer 320. A mixer 320 mixes the amplified signal with received signals provided by the antenna 312 through the splitter, coupler, switch, or duplexer 310. A conditioner 319, such as a low noise amplifier (LNA), can be used before the mixer 320 to process the signals provided by the antenna 312. The mixed signal produced by the mixer 320 is provided to a bandpass filter 322, which filters the signal. The filtered signal can be provided to components in an additional stage, such as an amplifier, a lower-frequency analog-to-digital converter, or other components in the "receive path" of a device.

Each of the variable attenuators 306 and 314 includes any suitable structure for providing variable attenuation controlled separately by a controller. Each of the amplifiers 302 and 318 includes any suitable structure for providing amplification. Each of the splitters, couplers, switches, duplexers, or dividers 304 and 310 includes any suitable structure for dividing access to one or more components. The antenna 312 includes any suitable structure for transmitting and/or receiving wireless signals. The mixer 320 includes any suitable structure for mixing signals. The filter 322 includes any suitable structure for filtering a signal with an appropriate passband.

As shown in FIG. 3B, the adjustable power transmission control circuit 350 includes many of the same components 352-358 and 362-372 as shown in FIG. 3A. In FIG. 3B, however, the variable attenuator 356 is provided with an additional amplifier 374. This combination can also be used to compensate for some upper spectral loss. Also, a directional coupler 360 is used to provide an input to the mixer 370. Here, a portion of the energy transmitted to or from the antenna 362 can be coupled to the mixer 370 by the directional coupler 360.

In the embodiments shown in FIGS. 3A and 3B, one or more variable attenuators are used and controlled by the controller 254. Here, the variable attenuators are used to control both the radiated power level of a device and the processing of received signals. The radiated power level of the device can be set in accordance with different applications, environments, and regulations. Since both the frequency spectrum and the power of the generated signals can be digitally controlled, radar systems and other systems can be made more flexible and accurate with consistent performance.

Although FIGS. 3A and 3B illustrate example adjustable power transmission control circuits 300 and 350 using highly accurate signal generation, various changes may be made to FIGS. 3A and 3B. For example, the controller in FIGS. 3A and 3B need not necessarily represent the same controller 254 used in FIG. 2. Also, while a highly accurate signal is used here for both transmission and reception, the highly accurate signal from the prior stage could be used for either transmission or reception. In fact, a device could include only a transmission path or only a receive path if the device represents a transmit-only device or a receive-only device.

Figure 4:
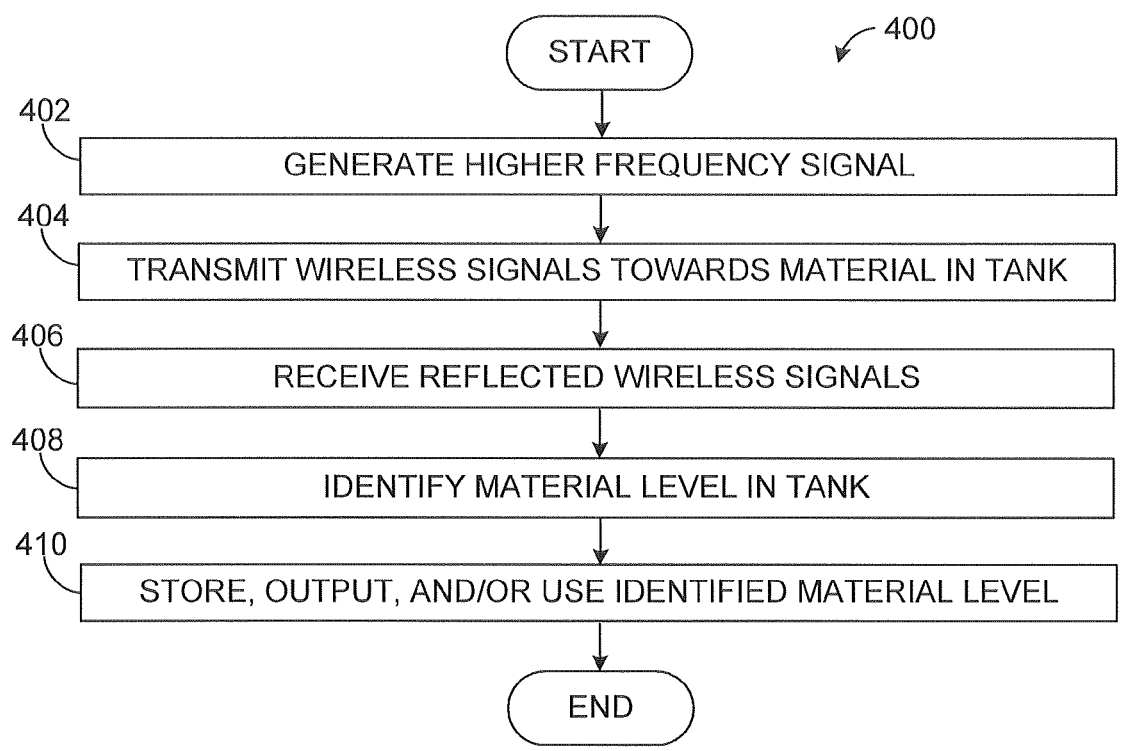
FIG. 4 illustrates an example method for level gauging using highly accurate signal generation according to this disclosure.

FIG. 4 illustrates an example method 400 for level gauging using highly accurate signal generation according to this disclosure. As shown in FIG. 4, an accurate higher-frequency signal is generated at step 402. This could include, for example, the sensor 106 using the multiple PLL circuit 200 of FIG. 2 to generate a 20 GHz, 60 GHZ, or 80 GHz wideband signal with high accuracy, regardless of temperature or transmission power level.

Wireless signals are transmitted towards material in a tank at step 404, and reflected signals are received at step 406. This could include, for example, the sensor 106 generating wireless signals that are transmitted from the antenna 108 towards the material 104 in the tank 102 and receiving wireless signals reflected from, among other things, the material 104. The wireless signals transmitted to the material 104 could be generated using the highly accurate signal produced at step 402, and/or the wireless signals received from the material 104 could be processed using the highly accurate signal produced at step 402.

The level of material in the tank is identified at step 408. This could include, for example, the processing system 110 using time of flight or other techniques used in level gauges to calculate the level of material 104 in the tank 102. The identified level is stored, output, and/or used in any suitable manner at step 410. This could include, for example, the processing system 110 displaying the identified level, storing the identified level in a memory, or transmitting messages containing the identified level.

Although FIG. 4 illustrates an example method 400 for level gauging using highly accurate signal generation, various changes may be made to FIG. 4. For example, while shown as a series of steps, various steps in FIG. 4 may overlap, occur in parallel, or occur multiple times.

Figure 5:
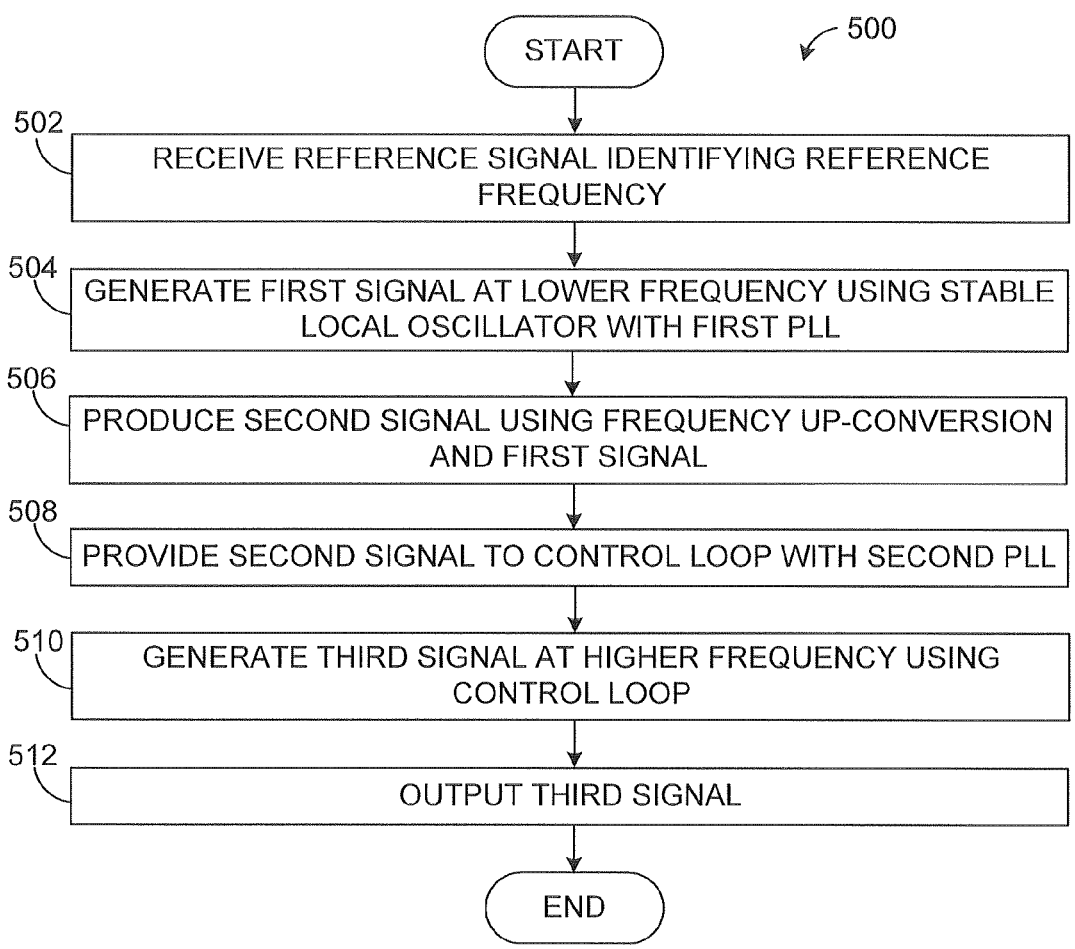
FIG. 5 illustrates an example method for highly accurate signal generation according to this disclosure.

FIG. 5 illustrates an example method 500 for highly accurate signal generation according to this disclosure. As shown in FIG. 5, a reference signal identifying a reference frequency is received at step 502. This could include, for example, the circuit 200 receiving the signal 218 defining a reference frequency.

A first signal is generated at a lower frequency using a stable local oscillator with a first PLL at step 504. This could include, for example, the circuit 200 generating the signal 214 using the PLL-based stable local oscillator 202. The signal 214 is generated by the voltage-controlled oscillator 206 using the phase-locked loop module 208, which receives the reference signal identifying the reference frequency.

A second signal is generated using frequency up-conversion and the first signal at step 506. This could include, for example, the circuit 200 using the frequency up-converter 224 to increase the frequency of the signal 214 to produce the signal 226. The frequency of the signal 214 could be increased by any suitable factor.

The second signal is provided to a control loop with a second PLL at step 508. This could include, for example, providing the signal 226 to the mixer 230 in the PLL-based control loop 204.

A third signal is generated at a higher frequency using the control loop at step 510. This could include, for example, the circuit 200 generating the signal 246 using the PLL-based control loop 204. The signal 246 is generated by the voltage-controlled oscillator 236 using the phase-locked loop module 238, which receives the reference signal identifying the reference frequency.

The third signal is output at step 512. This could include, for example, providing the signal 246 to one of the circuits 300 or 350 in FIG. 3A or 3B or to any other suitable component or system.

Although FIG. 5 illustrates an example method 500 for highly accurate signal generation, various changes may be made to FIG. 5. For example, while shown as a series of steps, various steps in FIG. 5 may overlap, occur in parallel, or occur multiple times.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The terms "higher" and "lower" refer to relative values (such as relative frequencies) and do not involve any specific values or ranges of values. The term "couple" and its derivatives refer to any direct or indirect communication between two or more elements, whether or not those elements are in physical contact with one another. The terms "algorithm" and "program" refers to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a stable local oscillator comprising a first control loop, the first control loop comprising (i) a first voltage-controlled oscillator configured to generate a first output signal and (ii) a first phase-locked loop module;
   a frequency up-converter configured to increase a frequency of the first output signal;
   a second control loop configured to receive the up-converted first output signal, the second control loop comprising (i) a second voltage-controlled oscillator configured to generate a second output signal, (ii) a second phase-locked loop module, and (iii) a mixer having a first input coupled to the frequency up-converter, a second input coupled to the second voltage-controlled oscillator, and an output coupled to the second phase-locked loop module;
   a buffer coupled between the stable local oscillator and the frequency up-converter; and
   a filter coupled between the frequency up-converter and the mixer.

2. The apparatus of claim 1, further comprising:
   a reference frequency source configured to generate a signal identifying a reference frequency and to provide the signal identifying the reference frequency to the first and second phase-locked loop modules.

3. An apparatus comprising:
   a stable local oscillator comprising a first control loop, the first control loop comprising (i) a first voltage-controlled oscillator configured to generate a first output signal and (ii) a first phase-locked loop module;
   a frequency up-converter configured to increase a frequency of the first output signal; and
   a second control loop configured to receive the up-converted first output signal, the second control loop comprising:
     a second voltage-controlled oscillator configured to generate a second output signal;
     a second phase-locked loop module;
     a mixer having a first input coupled to the frequency up-converter, a second input coupled to the second voltage-controlled oscillator, and an output coupled to the second phase-locked loop module;
     a first amplifier coupled between the mixer and the second phase-locked loop module;
       a filter coupled to the second phase-locked loop module; and
     a second amplifier coupled between the filter and the second voltage-controlled oscillator.

4. An apparatus comprising:
   a stable local oscillator comprising a first control loop, the first control loop comprising (i) a first voltage-controlled oscillator configured to generate a first output signal, (ii) a first phase-locked loop module, (iii) a filter coupled to the first phase-locked loop module, and (iv) an amplifier coupled between the filter and the first voltage-controlled oscillator;
   a frequency up-converter configured to increase a frequency of the first output signal; and
   a second control loop configured to receive the up-converted first output signal, the second control loop comprising (i) a second voltage-controlled oscillator configured to generate a second output signal and (ii) a second phase-locked loop module.

5. An apparatus comprising:
   a stable local oscillator comprising a first control loop, the first control loop comprising (i) a first voltage-controlled oscillator configured to generate a first output signal and (ii) a first phase-locked loop module;
   a frequency up-converter configured to increase a frequency of the first output signal;
   a second control loop configured to receive the up-converted first output signal, the second control loop comprising (i) a second voltage-controlled oscillator configured to generate a second output signal and (ii) a second phase-locked loop module;
   an amplifier configured to receive and amplify the second output signal; and
   a variable attenuator configured to receive and attenuate the amplified second output signal.

6. The apparatus of claim 5, wherein the variable attenuator is coupled to an antenna configured to transmit wireless signals based on the attenuated second output signal.

7. The apparatus of claim 5, wherein the variable attenuator is coupled to a mixer configured to mix the attenuated second output signal with signals from one of: an antenna and a directional coupler.

8. An apparatus comprising:
a stable local oscillator comprising a first control loop, the first control loop comprising (i) a first voltage-controlled oscillator configured to generate a first output signal and (ii) a first phase-locked loop module;
a frequency up-converter configured to increase a frequency of the first output signal;
a second control loop configured to receive the up-converted first output signal, the second control loop comprising (i) a second voltage-controlled oscillator configured to generate a second output signal and (ii) a second phase-locked loop module, wherein the second control loop forms part of a first stage; and
a second stage configured to receive the second output signal and generate a higher-frequency third output signal, the second stage comprising a third control loop, the third control loop comprising (i) a third voltage-controlled oscillator configured to generate the third output signal and (ii) a third phase-locked loop module.

9. A level gauge comprising:
a sensor configured to transmit radio frequency wireless signals towards material in a tank and receive wireless signals reflected off the material in the tank; and
a processing system configured to identify a level of the material in the tank based on the wireless signals transmitted towards and reflected off the material in the tank;
wherein the sensor comprises:
a phase-locked loop based stable local oscillator configured to generate a first output signal; and
a phase-locked loop based control loop configured to generate a second output signal based on the first output signal.

10. The level gauge of claim 9, wherein:
the phase-locked loop based stable local oscillator comprises (i) a first voltage-controlled oscillator configured to generate the first output signal and (ii) a first phase-locked loop module;
the sensor further comprises a frequency up-converter configured to increase a frequency of the first output signal; and
the phase-locked loop based control loop is configured to receive the up-converted first output signal, the control loop comprising (i) a second voltage-controlled oscillator configured to generate the second output signal and (ii) a second phase-locked loop module.

11. The level gauge of claim 10, wherein the phase-locked loop based control loop further comprises:
a mixer having a first input coupled to the frequency up-converter, a second input coupled to the second voltage-controlled oscillator, and an output coupled to the second phase-locked loop module.

12. The level gauge of claim 10, wherein the sensor further comprises:
a reference frequency source configured to generate a signal identifying a reference frequency and to provide the signal identifying the reference frequency to the first and second phase-locked loop modules.

13. The level gauge of claim 9, further comprising:
an amplifier configured to receive and amplify the second output signal; and
a variable attenuator configured to receive and attenuate the amplified second output signal.

14. The level gauge of claim 13, wherein the variable attenuator is coupled to an antenna configured to transmit the wireless signals towards the material in the tank, the transmitted wireless signals based on the attenuated second output signal.

15. The level gauge of claim 13, wherein the variable attenuator is coupled to a mixer configured to mix the attenuated second output signal with signals based on the wireless signals reflected off the material in the tank and received by an antenna.

16. A method comprising:
generating a first signal using a stable local oscillator that comprises a first control loop, the first control loop comprising a first voltage-controlled oscillator and a first phase-locked loop module;
increasing a frequency of the first signal to generate an up-converted first signal;
generating a second signal based on the up-converted first signal using a second control loop, the second control loop comprising a second voltage-controlled oscillator and a second phase-locked loop module;
amplifying the second signal;
attenuating the amplified second signal; and
at least one of:
transmitting outgoing radio frequency wireless signals using the attenuated second signal; and
processing incoming radio frequency wireless signals using the attenuated second signal.

17. The method of claim 16, wherein generating the second signal comprises:
mixing the up-converted first signal with an output of the second voltage-controlled oscillator; and
providing a signal generated by the mixing to the second phase-locked loop module.

18. An apparatus comprising:
a stable local oscillator comprising a first control loop, the first control loop comprising (i) a first voltage-controlled oscillator configured to generate a first output signal and (ii) a first phase-locked loop module;
a frequency up-converter configured to increase a frequency of the first output signal to generate an up-converted first output signal;
a second control loop configured to receive the up-converted first output signal, the second control loop comprising (i) a second voltage-controlled oscillator configured to generate a second output signal that has a frequency higher than the frequency of the first output signal, (ii) a second phase-locked loop module, and (iii) a mixer having a first input coupled to an output of the frequency up-converter, a second input coupled to an output of the second voltage-controlled oscillator, and an output coupled to the second phase-locked loop module and configured to provide a mixed signal to the second phase-locked loop module; and
a stable reference frequency source configured to generate a reference signal having a reference frequency and to provide the reference signal to the first and second phase-locked loop modules;
wherein the first phase-locked loop module is configured to compare a phase of the first output signal to a phase of the reference signal; and
wherein the second phase-locked loop module is configured to compare a phase of the mixed signal to the phase of the reference signal.

19. The apparatus of claim 18, wherein the stable reference frequency source is configured to generate the reference signal without input from the control loops.

20. A level gauge comprising:
- a sensor configured to transmit radio frequency wireless signals towards material in a tank and receive wireless signals reflected off the material in the tank; and
- a processing system configured to identify a level of the material in the tank based on the wireless signals transmitted towards and reflected off the material in the tank;

wherein the sensor comprises:
- a stable local oscillator comprising a first control loop, the first control loop comprising (i) a first voltage-controlled oscillator configured to generate a first output signal and (ii) a first phase-locked loop module;
- a frequency up-converter configured to increase a frequency of the first output signal to generate an up-converted first output signal;
- a second control loop configured to receive the up-converted first output signal, the second control loop comprising (i) a second voltage-controlled oscillator configured to generate a second output signal that has a frequency higher than the frequency of the first output signal, (ii) a second phase-locked loop module, and (iii) a mixer having a first input coupled to an output of the frequency up-converter, a second input coupled to an output of the second voltage-controlled oscillator, and an output coupled to the second phase-locked loop module and configured to provide a mixed signal to the second phase-locked loop module; and
- a stable reference frequency source configured to generate a reference signal having a reference frequency and to provide the reference signal to the first and second phase-locked loop modules;

wherein the first phase-locked loop module is configured to compare a phase of the first output signal to a phase of the reference signal; and wherein the second phase-locked loop module is configured to compare a phase of the mixed signal to the phase of the reference signal.

21. A method comprising:
- generating a first signal using a stable local oscillator that comprises a first control loop, the first control loop comprising (i) a first voltage-controlled oscillator and (ii) a first phase-locked loop module;
- increasing a frequency of the first signal to generate an up-converted first signal;
- generating a second signal based on the up-converted first signal using a second control loop, the second signal having a frequency higher than the frequency of the first signal, the second control loop comprising (i) a second voltage-controlled oscillator, (ii) a second phase-locked loop module, and (iii) a mixer having a first input coupled to an output of the frequency up-converter, a second input coupled to an output of the second voltage-controlled oscillator, and an output coupled to the second phase-locked loop module and providing a mixed signal to the second phase-locked loop module; and
- generating a reference signal having a reference frequency using a stable reference frequency source and providing the reference signal to the first and second phase-locked loop modules;

wherein the first phase-locked loop module compares a phase of the first signal to a phase of the reference signal; and wherein the second phase-locked loop module compares a phase of the mixed signal to the phase of the reference signal.

* * * * *